(12) United States Patent
Behun et al.

(10) Patent No.: US 6,590,278 B1
(45) Date of Patent: Jul. 8, 2003

(54) ELECTRONIC PACKAGE

(75) Inventors: John Richard Behun, Williston, VT (US); Douglas J. Hall, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/043,060

(22) Filed: Jan. 8, 2002

(51) Int. Cl.[7] .................................. H01L 23/495
(52) U.S. Cl. ........................... 257/675; 257/706
(58) Field of Search ................. 257/675, 706, 257/712; 438/122; 333/247; 439/67; 264/1.7; 361/386, 744; 217/73; 324/755

(56) References Cited

U.S. PATENT DOCUMENTS

| | | | | |
|---|---|---|---|---|
| 4,985,186 A | * | 1/1991 | Nose et al. ................. 264/1.7 |
| 5,155,661 A | * | 10/1992 | Nagesh et al. ............. 361/386 |
| 5,184,211 A | * | 2/1993 | Fox ............................. 257/706 |
| 5,285,108 A | * | 2/1994 | Hasting et al. ............ 257/712 |
| 5,371,654 A | * | 12/1994 | Beaman et al. ........... 361/744 |
| 5,426,405 A | * | 6/1995 | Miller et al. ............... 333/247 |
| 5,450,283 A | | 9/1995 | Lin et al. |
| 5,530,291 A | * | 6/1996 | Chan et al. ................ 257/723 |
| 5,621,615 A | | 4/1997 | Dawson et al. |
| 5,672,548 A | | 9/1997 | Culnane et al. |
| 5,726,079 A | | 3/1998 | Johnson |
| 5,744,863 A | | 4/1998 | Culnane et al. |
| 5,757,621 A | | 5/1998 | Patel |
| 5,785,799 A | | 7/1998 | Culnane et al. |
| 5,888,849 A | | 3/1999 | Johnson |
| 5,947,750 A | * | 9/1999 | Alcoe et al. ................. 439/67 |
| 5,990,552 A | | 11/1999 | Xie et al. |
| 6,191,480 B1 | | 2/2001 | Kastberg et al. |
| 6,212,074 B1 | | 4/2001 | Gonsalves et al. |
| 6,340,894 B1 | * | 1/2002 | Farnworth et al. ........ 324/755 |

\* cited by examiner

*Primary Examiner*—David Nelms
*Assistant Examiner*—Thinh T Nguyen
(74) *Attorney, Agent, or Firm*—Spencer K. Warnick; Hoffman, Warnick & D'Alessandro

(57) ABSTRACT

An electronic package including an elastomeric member that supports a substantial portion of the load of a heat sink. The elastomeric member includes portions that are compressible to different degrees.

20 Claims, 4 Drawing Sheets

ELECTRONIC PACKAGE

BACKGROUND OF THE INVENTION

1. Technical Field

The present invention relates generally to electronic packages, and more particularly, to an electronic package including an elastomeric member that supports a substantial portion of the load of a heat sink.

2. Related Art

Current electronic packages are built with semiconductor chips or devices that are exposed so that an end user can connect a heat sink to the chip without additional thermally resistant layers. The chips may be encapsulated or have a layer of material about the chip. In many cases, the chips are flipped and connected with a ball grid to a substrate.

One problem with this arrangement is that users can damage the chip when they attach the heat sink. One effort to remedy this problem is the use of a ring around the chip that is lower than the chip to guide the heat sink into position. This procedure, however, still may cause damage to the chip when the heat sink meets the chip. In addition, once the heat sink is in position, it needs to be held on with enough force to remain in contact with the chip. Most of the heat sink load is still on the chip with this configuration. The heat sink load includes not only the weight of the heat sink, but also the force of the coupling mechanism, e.g., spring clips, used to connect the heat sink to the substrate and any shock or vibration experienced during use.

Another problem relative to attaching chips and heat sinks is that new chip technology is advancing with chips that have internal structures that are more fragile than in the past. For instance, one new chip technology provides a dielectric inside the chip such that it includes an outer glass like material with an organic and softer, inner material. These chips cannot withstand the heat sink load as well as older chip technology. Hence, when a heat sink is forced into contact with a new chip, the heat sink load can more easily damage the chip.

The above-described problem is magnified in that the new chips give off more heat and, therefore, require larger and heavier heat sinks than predecessor chips. This is the case even though the new chips are smaller. New chips also have different coefficients of thermal expansion (CTE) than current heat sinks, which also increases the stresses experienced by the new chips.

One mechanism that has been used to protect chips is adding a lid over the chip. The lid is oftentimes attached to the chip with an adhesive. A lid, however, adds another layer to the package and, hence, thermal resistance, which negatively impacts performance and reliability. Further thermal resistance is created when an adhesive layer is used to attach the lid to the chip. Another problem with the use of lids is that users want to be able to add the heat sink to the package and then conduct testing. In many cases, the heat sink is also attached to the lid with an adhesive. If the package does not work, the user must then remove the heat sink and/or the lid. Since the heat sink and lid are adhered in place, the user must overcome the adhesive force to remove the heat sink and/or the lid, which can damage the chip.

Another effort to solve the chip protection problem includes using an adhesive guard applied to the substrate around the chip. The adhesive guard is applied by the user at the time of final mechanical assembly of the finished product. This has solved some of the damage that occurred from that point on but has had no impact on damage occurring sooner in the process. In addition, this solution was not implemented so as to support any significant portion of the heat sink load in operation. Hence, the chip is still susceptible to damage during use.

In view of the foregoing, there is a need in the art for an electronic package having a mechanism to place a heat sink in contact with a chip but not support the heat sink load on the chip.

SUMMARY OF THE INVENTION

The invention includes an electronic package having an elastomeric member that supports a substantial portion of the load of a heat sink. The elastomeric member includes portions that are compressible to different degrees. The invention allows larger heat sinks on smaller and more fragile chips, and protects the chips from damage.

A first aspect of the invention includes an electronic package comprising: a substrate having a first portion and a second portion; a semiconductor chip positioned on the first portion; and an elastomeric member positioned on the second portion, wherein the elastomeric member supports a substantial portion of a heat sink load.

A second aspect of the invention is directed to an electronic package comprising: a substrate having a first portion and a second portion; a semiconductor chip positioned on the first portion of the substrate; an elastomeric member positioned on the second portion of the substrate; and a heat sink positioned on the semiconductor chip and on the elastomeric member, wherein the elastomeric member supports a substantial portion of a load of the heat sink to prevent damage of the semiconductor chip.

A third aspect of the invention is directed to a method of constructing an electronic package, the method comprising the steps of: providing a substrate; coupling a semiconductor chip to the substrate; placing an elastomeric member having portions compressible to different degrees adjacent the semiconductor chip; and coupling a heat sink to the substrate such that a substantial portion of a load of the heat sink is supported by the elastomeric member.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE INVENTION

Figure 1:
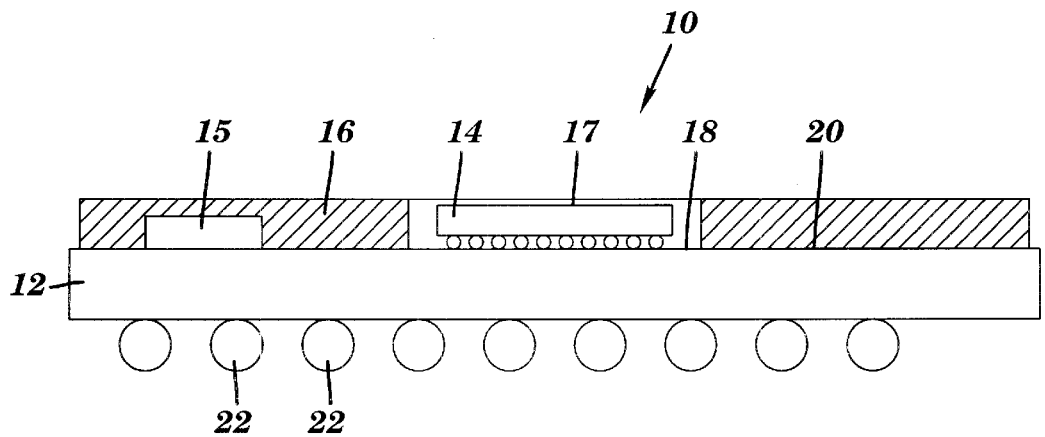
FIG. 1 shows a first embodiment of an electronic package.

With reference to FIG. 1, the invention includes an electronic package 10 including a substrate 12, a semiconductor chip or device 14 (hereinafter "chip") and an elastomeric member 16. Substrate 12 includes a first portion 18 upon which semiconductor chip 14 is positioned, and a second portion 20 upon which elastomeric member 16 is positioned. Substrate 12 may be any well known type of substrate. For example, as illustrated, substrate 12 is constructed as a ceramic ball grid array (CBGA) or a flip chip plastic ball grid array (FC-PBGA), which includes balls 22 for interconnection to other components. Substrate 12 may also be constructed with any well known organic material such as urethane. Other devices 15 may also be provided on substrate 12, and may be covered by elastomeric member 16.

Figure 2:
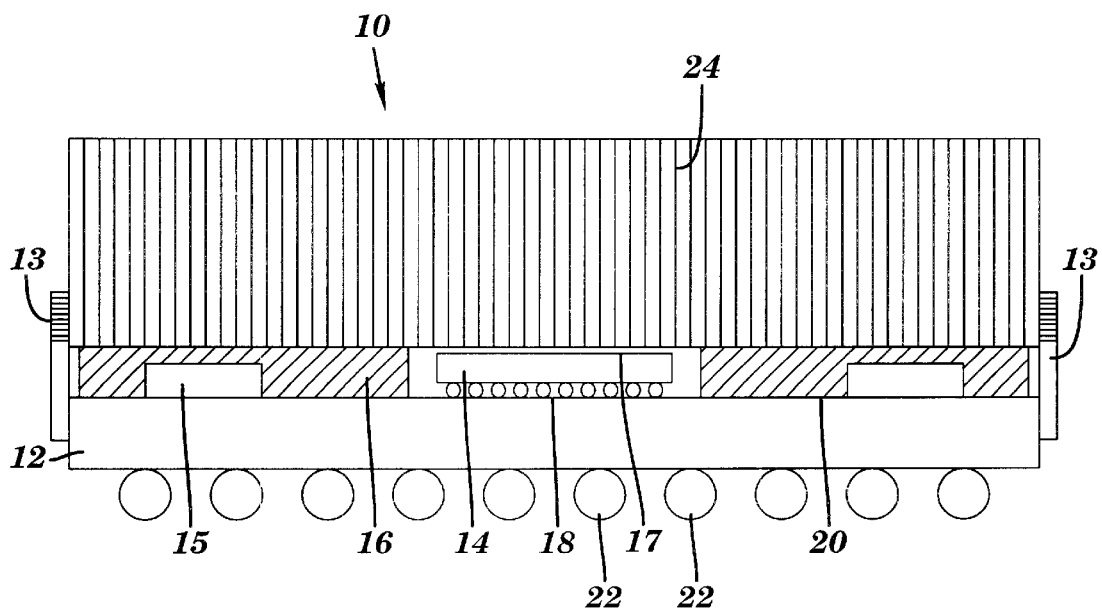
FIG. 2 shows the electronic package of FIG. 1 including a heat sink.

Referring to FIG. 2, electronic package 10 may also include a heat sink 24 positioned on chip 14 and on member 16. Heat sink 24 may be coupled to substrate 12 using any well known coupling mechanism 13 such as a spring clip, screw or latch.

FIG. 2 also illustrates how elastomeric member 16 is constructed to provide adequate but limited contact of heat sink 24 to chip 14 while also allowing for thermal expansion/contraction provided by normal assembly tolerances. As a result, chip 14 need not be encapsulated in the over-mold material or provided with a lid for protection. In order to provide this functionality, member 16 is provided such that it supports a substantial portion of the load of heat sink 24 and allows limited contact of heat sink 24 to chip 14. More particularly, limited contact refers to elastomeric member 16 providing a spring back force defined by the difference between the maximum force chip 14 can withstand and the heat sink load. The heat sink load includes static and dynamic loads including, for example, the weight of heat sink 24, the coupling force of coupling mechanism 13 and any shock or vibration experienced during use.

The ability to support a substantial portion of the load of heat sink 24 and allow limited contact with chip 14 can be provided in a number of ways. In one embodiment, shown in FIG. 1, elastomeric member 16 may be made of a material that allows compressibility to a certain extent to provide the feedback force, and then stiffens against further compressibility. Also, member 16 is sized to be slightly higher than a top surface 17 of chip 14. When a heat sink 24 is coupled to substrate 12, the heat sink load closes the gap between a lower surface of the heat sink and top surface 17 of chip 14. Member 16 may be made of a compressible or compliant material such as urethane.

Figure 3:
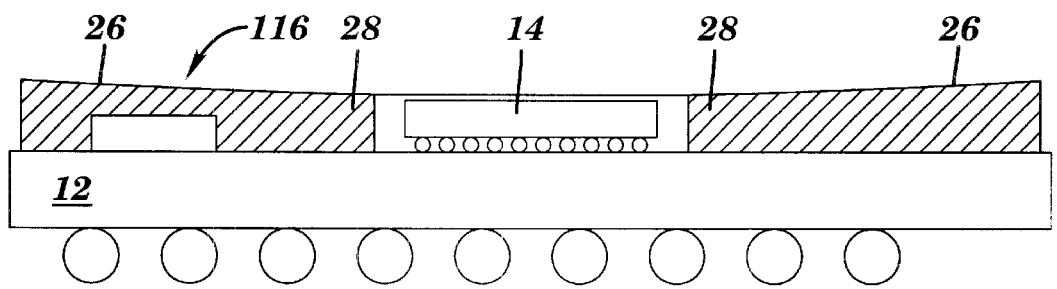
FIG. 3 shows a second embodiment of the electronic package.
Figure 4:
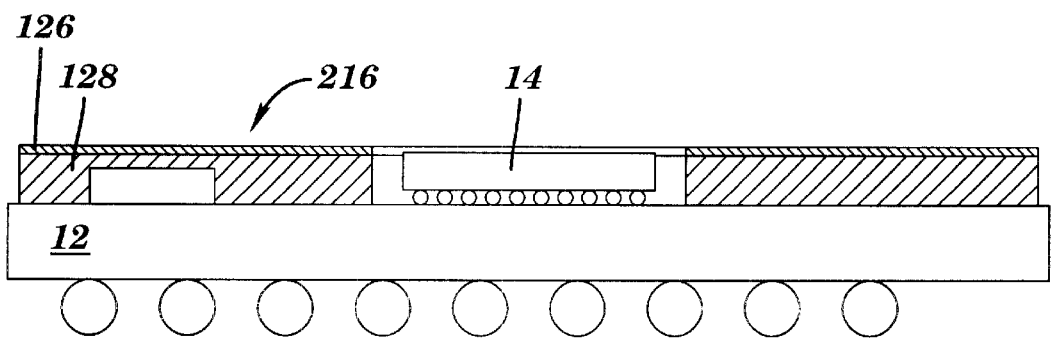
FIG. 4 shows a third embodiment of the electronic package.
Figure 5:
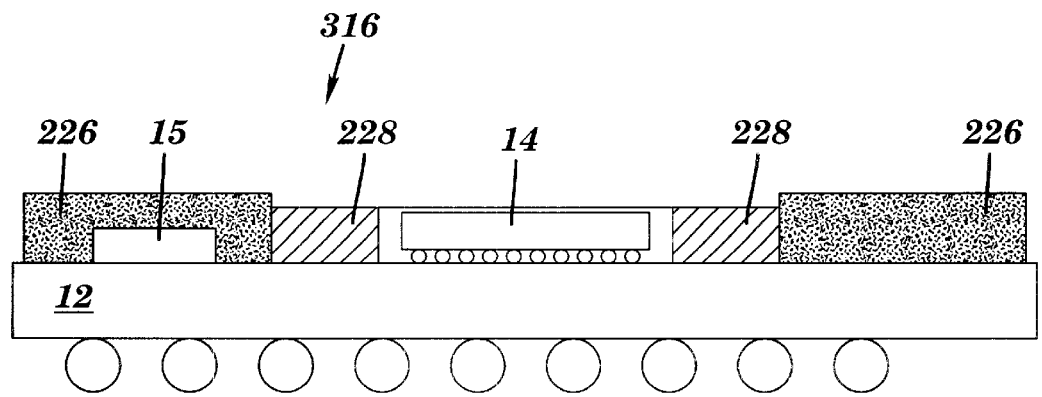
FIG. 5 shows a fourth embodiment of the electronic package.

Elastomeric member 16 may also support a substantial portion of heat sink 24 load and allow limited contact with chip 14 by having portions that are compressible to different degrees. The different compressibility portions of member 16 may be provided by an assortment of configurations. FIGS. 3–5 show embodiments in which the elastomeric member includes a first portion having a first compressibility and a second portion having a second compressibility. The first compressibility is greater than the second compressibility. That is, the extent to which the first portion can be compressed is greater than the second portion (the second portion is stiffer). FIG. 3 shows an embodiment of an elastomeric member 116 in which the portions of differing compressibility are provided by a first portion 26 being thicker than a second portion 28. In one embodiment, the thicker first portion 26 is positioned at a periphery of member 116 while the thinner second portion 28 is adjacent semiconductor chip 14. Although second portion 28 is shown as being thicker than chip 14, it may be the same thickness or slightly thinner than chip 14 when assembled to substrate 12 with heat sink 24. When heat sink 24 is coupled to substrate 12, it compresses first portion 26 of member 16. As this occurs, first portion's compressibility reduces such that further compression is resisted. As a result, heat sink 24 is positioned in limited contact with chip 14 and a substantial portion of the load of the heat sink is supported by member 16.

In the embodiment shown in FIG. 4, an elastomeric member 216 also includes a first portion 126 having a first compressibility and a second portion 128 having a second compressibility. In this case, however, first portion 126 is made of a first material and second portion 128 is made of a second material and each material has different compressibility. Preferably, first portion 126 is more compressible than second portion 128. That is, the first material allows for more compression, and the second material is stiffer. Alternatively, portions 126, 128 may be made of variants of the same material having different compressibility. When heat sink 24 is coupled to substrate 12, it compresses first portion 126. Once this occurs, second portion 128 resists further compression because it is less compressible, i.e., more rigid. As a result, heat sink 24 is positioned in limited contact with chip 14 and a substantial portion of its load is supported by member 216.

FIG. 5 shows an elastomeric member 316 in which the member is also constructed of a first portion 226 having a first compressibility and a second portion 228 having a second compressibility. Again, first portion 226 is more compressible than second portion 228. That is, the first material allows for more compression, and the second material is stiffer. In this embodiment, however, first portion 226 is positioned at a periphery of substrate 12 and is thicker than the second portion 228, which is positioned adjacent the semiconductor chip 14. First portion 226 may be thicker by any size that provides functionality. In one embodiment, first portion 226 is one millimeter thicker than second portion 228. When heat sink 24 is coupled to substrate 12, it compresses first portion 226. Once this occurs, second portion 228 resists further. compression because it is less compressible, i.e., more rigid. As a result, heat sink 24 is positioned in limited contact with chip 14 and a substantial portion of its load is supported by member 316.

Figure 6:
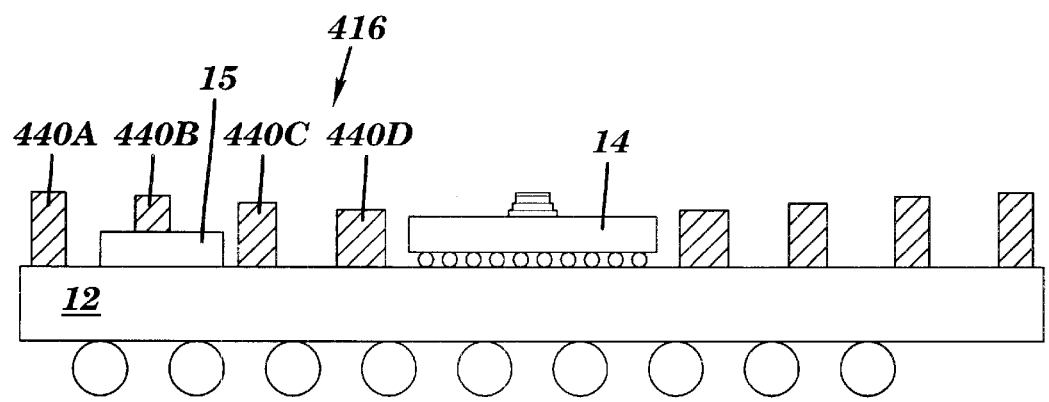
FIG. 6 shows a fifth embodiment of the electronic package.

In the above embodiments, the elastomeric member is formed as an integral member. That is, as a single piece of material or as coupled sections of materials. FIG. 6 shows an elastomeric member 416 where the member is provided as a number of posts 440A–D. Posts 440A–D may be configured to have decreasing height the closer to semiconductor chip 14 their position is to provide the varied compressibility. Alternatively, each post 440 may be constructed of material of varying compressibility similarly to the above-described embodiments. For instance, posts 440A, 440B may be made of a material that is more compressible than posts 440C, 440D. In another example, one or more of posts 440A–D may be made of two materials, one that is more compressible than the other.

The elastomeric member is preferably molded to substrate 12 early in construction of electronic package 10. Alternately, the member can be separately molded and joined to substrate 12 during assembly. Leaving chip 14 free of encapsulation allows direct contact between chip 14 and heat sink 24. It also does not influence chip underfill, which allows electronic package 10 to behave as it does in current bare die modules with respect to reliability.

Figure 7:
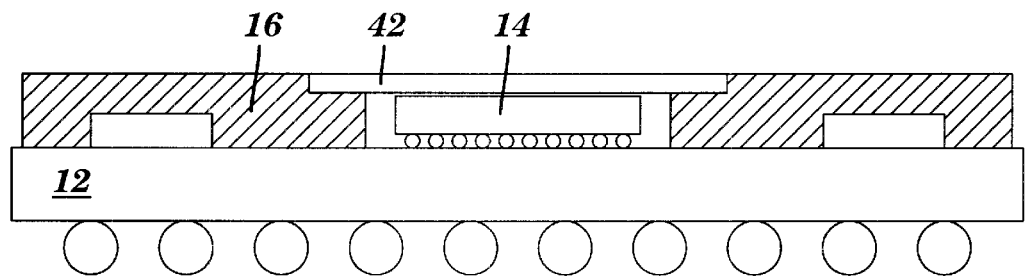
FIG. 7 shows an electronic package with an alternative lid.

FIG. 7 shows an electronic package constructed in accordance with one of the above-described embodiments (only FIG. 1 embodiment shown) that also includes a thermal layer 42 that covers semiconductor chip 14 to provide additional protection. Thermal layer 42 may be made of any highly thermal conductive elastomer material such a grease or phase change material. Thermal layer 42 adds slightly to the thermal resistance but adds improved mechanical protection for device 14.

The resiliency of the elastomeric member is preferably matched to the resiliency of thermal layer 42 such that the elastomeric member supports a substantial portion of the load applied by heat sink 24 and controls the amount of deflection in thermal layer 42 so as to control the thermal resistance without damage to chip 14. In this setting, the elastomeric member can either be molded or applied at the same time as thermal layer 42. Thermal layer 42 can be positioned over chip 14 and part of the member, as shown in FIG. 7; limited to only chip 14; or extend completely over chip 14 and the member. In either setting, the final thickness of thermal layer 42 is selected to limit the force applied to chip 14 by heat sink 24. This is accomplished by controlling mechanical tolerances and the relative compliance of the elastomeric member and thermal layer 42. Though providing no significant thermal advantage, the member and thermal layer 42 could be combined and composed entirely of thermally conductive material. In this case, force distribution would be controlled by adjusting the shape of the elastomeric member to give it the correct compliance relative to the portion in contact with chip 14.

In the FIG. 7 embodiment, thermal layer 42 contributes a thermal resistance proportional to the area in contact with chip 14. This is minimized by making thermal layer 42 as thin as possible but still results in a thermal resistance higher than for the direct contact of heat sink 24 to chip 14.

Figure 8:
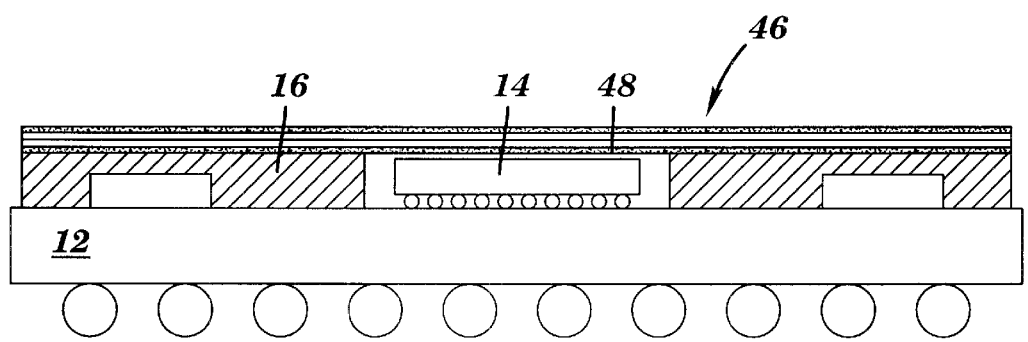
FIG. 8 shows an electronic package with an alternative heat spreader.

FIG. 8 shows an electronic package having an elastomeric member in accordance with one of the above-described embodiments (only FIG. 1 embodiment shown) and a high thermal conductivity heat spreader 46. Heat spreader 46 may be made of any high thermal conductivity material such as copper or aluminum. In this setting, a small gap 48 is positioned between heat spreader 46 and chip 14. When a heat sink is connected, the heat sink load applied closes gap 48 in the same manner as discussed with earlier embodiments.

In terms of methodology, the elastomeric member is preferably applied at the time of manufacture early in the assembly process so that it may protect chip 14. The method of constructing electronic package 10 may include: providing substrate 12; coupling chip 14 to substrate 12; placing an elastomeric member having portions compressible to different degrees adjacent chip 14; and coupling heat sink 24 to substrate 12 such that a substantial portion of the load of heat sink 24 is supported by the elastomeric member. As discussed above, coupling of heat sink 24 includes compressing the elastomeric member.

Electronic package 10 including the elastomeric member provides many advantages over rigid guard rings. As chips grow smaller and smaller the power densities require highly effective thermal solutions. Typically, this involves large and larger external heat sinks. These large heat sinks expose the chip to high static and dynamic loads. Supporting the heat sink with a carefully tailored compliant material removes this load from the device thereby minimizing damage and improving reliability.

Electronic package 10 including the elastomeric member offer a number of other advantages beyond those discussed above. For instance, the top of the elastomeric member is available for manufacturer information as is commonly marked on finished goods. In addition, some design elements that would normally be marked can be molded in. This could both improve appearance and reduce cost. The color for the elastomeric member can also be selected to improve the appearance of the finished part. The elastomeric member also provides protection to passive components (e.g., decoupling capacitors) mounted on substrate 12 with chip 14. In addition, the elastomeric member provides an easier surface with which pick-and-place tools can locate parts. If the elastomeric member is applied early in the manufacturing flow, it also protects chip 14 from handling damage.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An electronic package comprising:
    a substrate having a first section and a second section;
    a semiconductor chip positioned on the first section;
    an elastomeric member positioned on the second section; and
    a heat sink positioned in contact with the semiconductor chip and the elastomeric member,
    wherein the elastomeric member supports a substantial portion of a load of the heat sink.

2. The electronic package of claim 1, wherein the elastomeric member includes a first portion having a first compressibility and a second portion having a second compressibility, wherein the first compressibility is greater than the second compressibility.

3. The electronic portion of claim 2, wherein the first portion is positioned at a periphery of the substrate and the second portion is adjacent the semiconductor chip.

4. The electronic package of claim 2, wherein the first portion is made of a first material and the second portion is made of a second material.

5. The electronic package of claim 2, wherein the first portion is thicker than the second portion.

6. The electronic package of claim 2, wherein the elastomeric member is an integral member.

7. The electronic package of claim 1, wherein the elastomeric member has a height greater than the semiconductor chip.

8. The electronic package of claim 1, wherein the heat sink compresses the elastomeric member.

9. The electronic package of claim 8, further comprising a thermal layer between the heat sink and the semiconductor chip.

10. The electronic package of claim 8, further comprising a heat spreader between the heat sink and the semiconductor chip.

11. An electronic package comprising:
    a substrate having a first section and a second section;
    a semiconductor chip positioned on the first section;
    an elastomeric member positioned on the second section; and
    a heat sink positioned on the semiconductor chip and on the elastomeric member, wherein the elastomeric member supports a substantial portion of a load of the heat sink to prevent damage of the semiconductor chip.

12. The electronic package of claim 11, wherein the elastomeric member includes a first portion having a first compressibility and a second portion having a second compressibility, wherein the first compressibility is greater than the second compressibility.

13. The electronic portion of claim 12, wherein the first portion is positioned at a periphery of the elastomeric member and the second portion is positioned adjacent the semiconductor chip.

14. The electronic package of claim 12, wherein the first portion is made of a first material and the second portion is made of a second material.

15. The electronic package of claim 12, wherein the first portion is thicker than the second portion.

16. The electronic package of claim 12, wherein the elastomeric member is an integral member.

17. The electronic package of claim 11, wherein the elastomeric member has a height greater than the semiconductor chip.

18. The electronic package of claim 11, wherein the heat sink compresses the elastomeric member.

19. The electronic package of claim 11, further comprising one of a thermal layer and a heat spreader between the heat sink and the semiconductor chip.

20. A method of constructing an electronic package, the method comprising the steps of:

providing a substrate;

coupling a semiconductor chip to the substrate;

placing an elastomeric member having portions compressible to different degrees adjacent the semiconductor chip; and coupling a heat sink to the substrate such that the heat sink contacts the portions of the elastomeric member and a substantial portion of a load of the heat sink is supported by the elastomeric member.

* * * * *